(12) United States Patent
Lin

(10) Patent No.: US 7,894,195 B2
(45) Date of Patent: Feb. 22, 2011

(54) DISPOSING STRUCTURE FOR HOT SWAPPABLE MOTHERBOARD IN INDUSTRIAL COMPUTER CHASSIS

(75) Inventor: Te-Chang Lin, San Jose, CA (US)

(73) Assignee: Super Micro Computer Inc. CA (US)

( * ) Notice: Subject to any disclaimer, the term of this patent is extended or adjusted under 35 U.S.C. 154(b) by 169 days.

(21) Appl. No.: 12/428,633

(22) Filed: Apr. 23, 2009

(65) Prior Publication Data

US 2010/0271766 A1 Oct. 28, 2010

(51) Int. Cl.
*H05K 7/16* (2006.01)
(52) U.S. Cl. .................................... 361/727
(58) Field of Classification Search ............ 361/679.02, 361/679.48, 724–727, 748, 752
See application file for complete search history.

(56) References Cited

U.S. PATENT DOCUMENTS

| | | | | |
|---|---|---|---|---|
| 5,398,161 | A * | 3/1995 | Roy | 361/727 |
| 6,181,570 | B1 * | 1/2001 | Ellebrecht et al. | 361/797 |
| 6,540,522 | B2 * | 4/2003 | Sipe | 439/61 |
| 6,650,535 | B1 * | 11/2003 | Moss et al. | 361/679.33 |
| 6,816,368 | B2 * | 11/2004 | Yokosawa | 361/679.33 |
| 6,853,551 | B2 * | 2/2005 | Baar et al. | 361/679.33 |
| 7,083,422 | B2 * | 8/2006 | Campini et al. | 439/61 |
| 7,710,731 | B2 * | 5/2010 | McClure et al. | 361/727 |
| 7,821,792 | B2 * | 10/2010 | Belady et al. | 361/735 |
| 2003/0100198 | A1 * | 5/2003 | Hicks et al. | 439/65 |
| 2005/0281014 | A1 * | 12/2005 | Carullo et al. | 361/796 |
| 2005/0286221 | A1 * | 12/2005 | Yamana et al. | 361/687 |
| 2007/0217172 | A1 * | 9/2007 | Bisbikis et al. | 361/753 |
| 2007/0223200 | A1 * | 9/2007 | Fujiya et al. | 361/727 |
| 2008/0043405 | A1 * | 2/2008 | Lee et al. | 361/600 |
| 2008/0046617 | A1 * | 2/2008 | Lee et al. | 710/104 |
| 2008/0253076 | A1 * | 10/2008 | Chen | 361/684 |
| 2008/0298014 | A1 * | 12/2008 | Franco | 361/688 |
| 2009/0002934 | A1 * | 1/2009 | Carlson et al. | 361/684 |
| 2009/0097200 | A1 * | 4/2009 | Sharma et al. | 361/688 |
| 2010/0118440 | A1 * | 5/2010 | Qu et al. | 360/133 |

* cited by examiner

*Primary Examiner*—Anatoly Vortman
*Assistant Examiner*—Adrian S Wilson
(74) *Attorney, Agent, or Firm*—Chun-Ming Shih; HDLS IPR Services

(57) ABSTRACT

A disposing structure of industrial computer chassis includes a chassis shell, two motherboard trays and a back plate. The interior of the chassis shell is divided into a storage unit section and a motherboard section. The interior of the storage unit section is arranged at least one storage unit, while two motherboard trays are disposed in the motherboard section. The interior of each motherboard tray is arranged a motherboard. In the motherboard trays, at least one motherboard tray is extended a wedge frame toward the storage unit section. A transfer card having a hot swapping function is arranged on the wedge frame and is arranged by inserting into the corresponding motherboard. In addition, a back plate is arranged between the storage unit section and the motherboard section. Corresponding to the wedge frame, a slot capable of a hot swapping function is arranged on the back plate. In so doing, the transfer card may be inserted into the slot, thereby, providing a hot swapping function.

9 Claims, 4 Drawing Sheets

DISPOSING STRUCTURE FOR HOT SWAPPABLE MOTHERBOARD IN INDUSTRIAL COMPUTER CHASSIS

BACKGROUND OF THE INVENTION

1. Field of the Invention

The present invention in general relates to an industrial computer, in particular, to a disposing structure for hot swappable motherboard in industrial computer chassis applying to a server.

2. Description of Prior Art

In a prior industrial computer, a server supportably having a hot swapping function is so-called a "Blade Server". Under the prerequisite of continuous operation, this kind of server may be directly changed a malfunctioned motherboard therein. The so-called "Blade Server" is to integrate the hardware in a server system, such as: processor, memory, even hard disk drive, etc. into a motherboard shaped like a blade. In so doing, a piece of blade server piece is then a server. Many servers may work simultaneously in a same server chassis, sharing common sources, for example, server chassis, power supplier, display, etc. with each other. Therefore, when certain piece of blade sever is malfunctioned, it is possible to directly change it without disconnecting the power, avoiding the harassment and problem caused by the shutdown of the server.

However, in the current market, the selling price of a blade server is quite expensive. In general server, its motherboard is cheaper, but without the hot swapping function. So, how to make a motherboard of general server have the same hot swapping function as that of blade server becomes an issue intended to be addressed by the present invention.

Accordingly, after a substantially devoted study, in cooperation with the application of relatively academic principles, the inventor has finally proposed the present invention that is designed reasonably to possess the capability to improve the drawback of the prior art significantly.

SUMMARY OF THE INVENTION

The invention is mainly to provide a disposing structure for hot swappable motherboard in industrial computer chassis, in which the motherboard used in a general server is also provided with a hot swapping function to lower down its cost by boosting the applying function of a general server to possess the same hot swapping function as that of blade server.

Secondly, the invention is to provide a disposing structure for hot swappable motherboard in industrial computer chassis, including a chassis shell, two motherboard trays and a back plate. The interior of the chassis shell is divided into a storage unit section and a motherboard section. The interior of the storage unit section is arranged at least one storage unit, while two motherboard trays are disposed in the motherboard section. The interior of each motherboard tray is arranged a motherboard. In the motherboard trays, at least one motherboard tray is extended a wedge frame toward the storage unit section. A transfer card having a hot swapping function is arranged on the wedge frame and is connected by inserting into the corresponding motherboard. In addition, a back plate is arranged by erecting between the storage unit section and the motherboard section. Corresponding to the wedge frame, a slot capable of hot swapping function is arranged on the back plate. In so doing, the transfer card may be inserted into the slot, thereby, providing a hot swapping function.

BRIEF DESCRIPTION OF DRAWING

The features of the invention believed to be novel are set forth with particularity in the appended claims. The invention itself, however, may be best understood by reference to the following detailed description of the invention, which describes an exemplary embodiment of the invention, taken in conjunction with the accompanying drawings, in which:

DETAILED DESCRIPTION OF THE INVENTION

In cooperation with attached drawings, the technical contents and detailed description of the present invention are described thereinafter according to a preferable embodiment, not used to limit its executing scope. Any equivalent variation and modification made according to appended claims is all covered by the claims claimed by the present invention.

Figure 1:
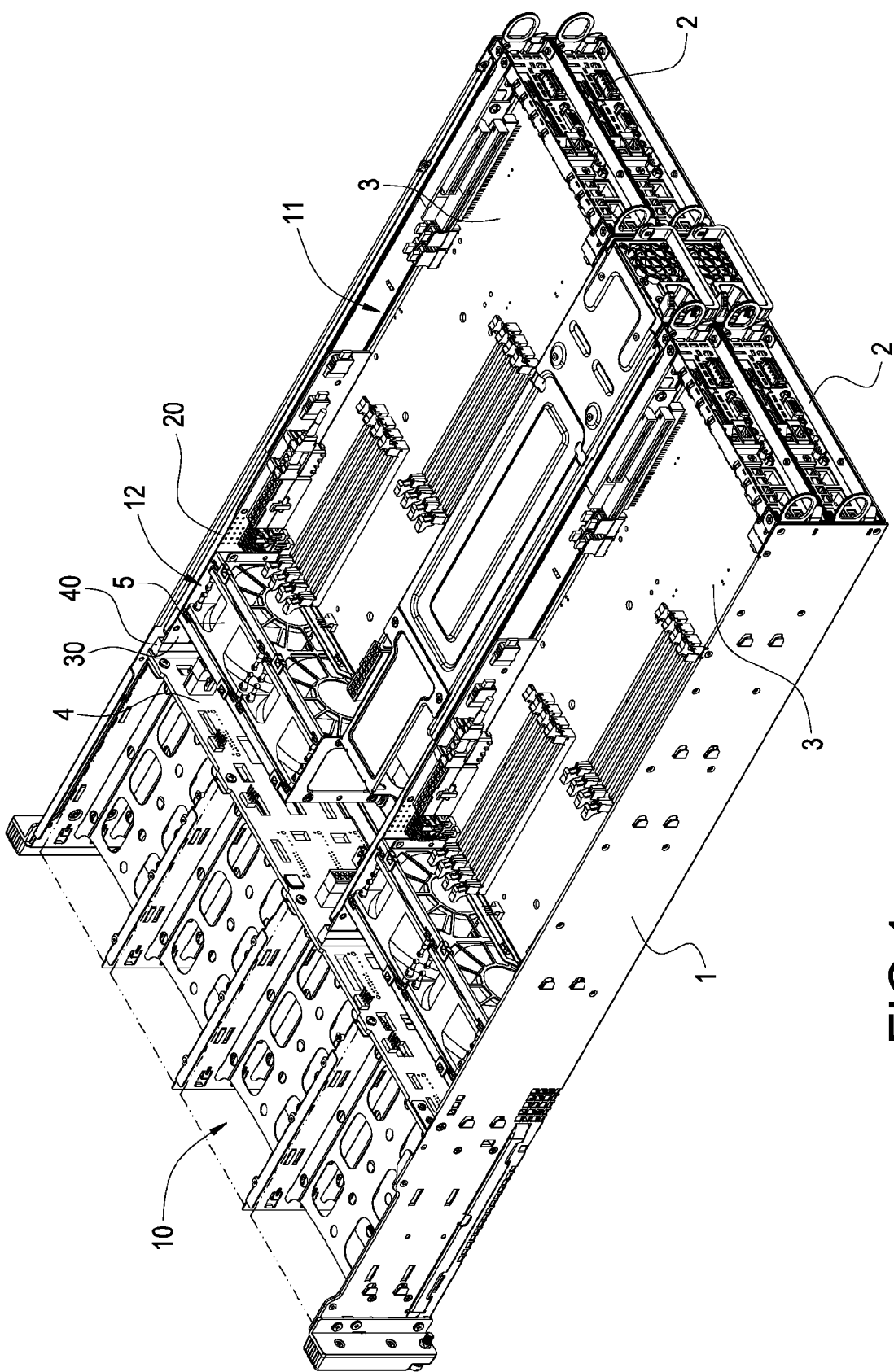
FIG. 1 is a perspective view of the internal structure of the present invention.

Please refer to FIG. 1, which is a perspective view of the internal structure of the present invention. The invention is to provide a disposing structure for hot swappable motherboard in industrial computer chassis, including a chassis shell 1 of industrial computer, at least two motherboard trays 2, a motherboard 3 arranged on the motherboard tray 2 and a back plate 4 connected to the storage unit (not shown).

According to a preferable embodiment of the invention, the chassis shell 1 is to provide each aforementioned assembly to be supported and disposed therein to be assembled into a single server or to further into a plurality of servers that may be commonly integrated into a larger scale of server system. The interior of the chassis shell 1 is divided into a storage unit section 10 and a motherboard section 11. In this embodiment proposed by the invention, the front half part of the chassis shell 1 is designated as the storage unit section 10, while the rear half part is designated as the motherboard section 11. In the meantime, it is also possible to arrange a fan section 12 between the storage unit section 10 and the motherboard section 11 to thereby constitute an aforementioned chassis shell 1.

Figure 2:
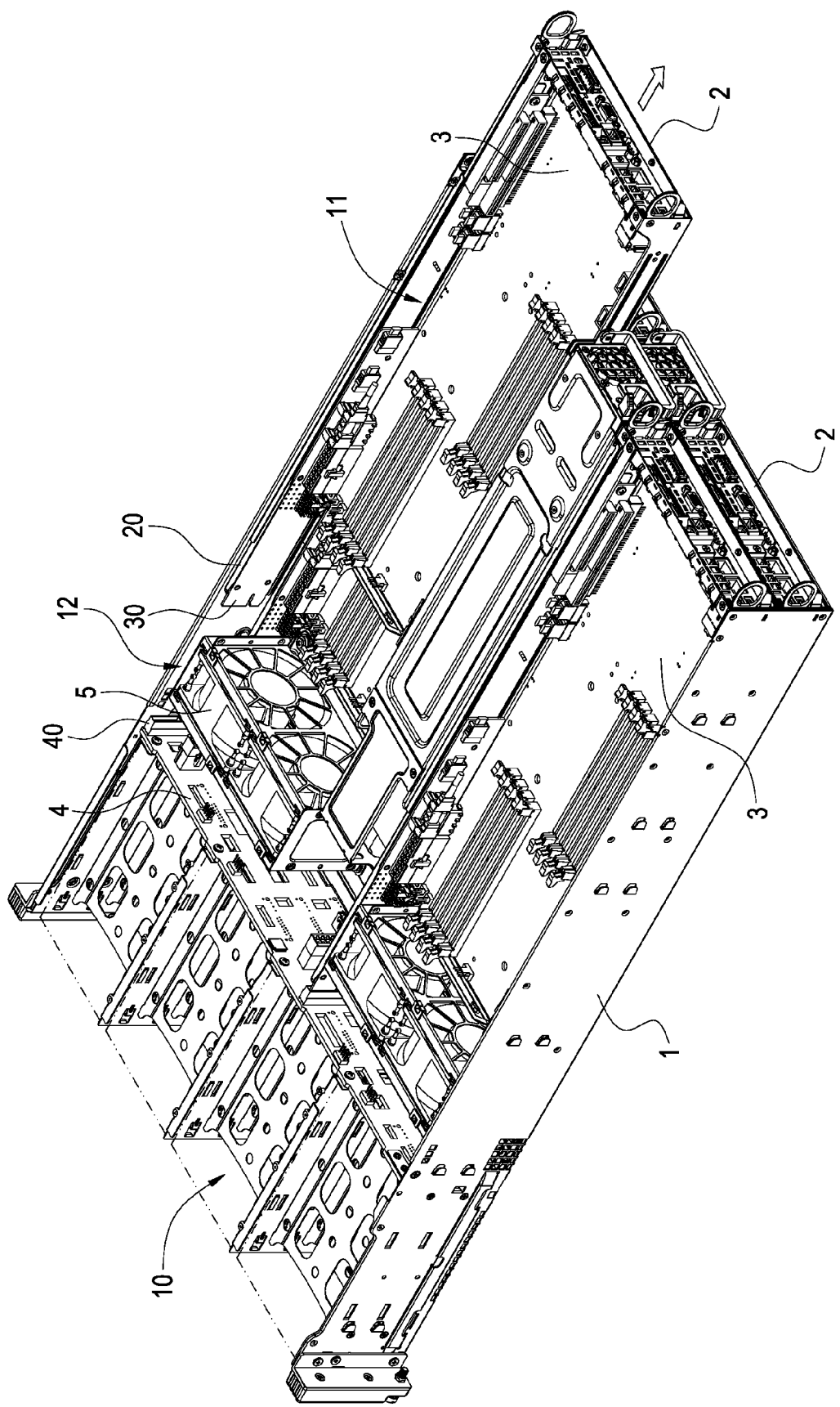
FIG. 2 is a perspective view of a single motherboard of the present invention, which has been drawn out of the chassis shell.
Figure 3:
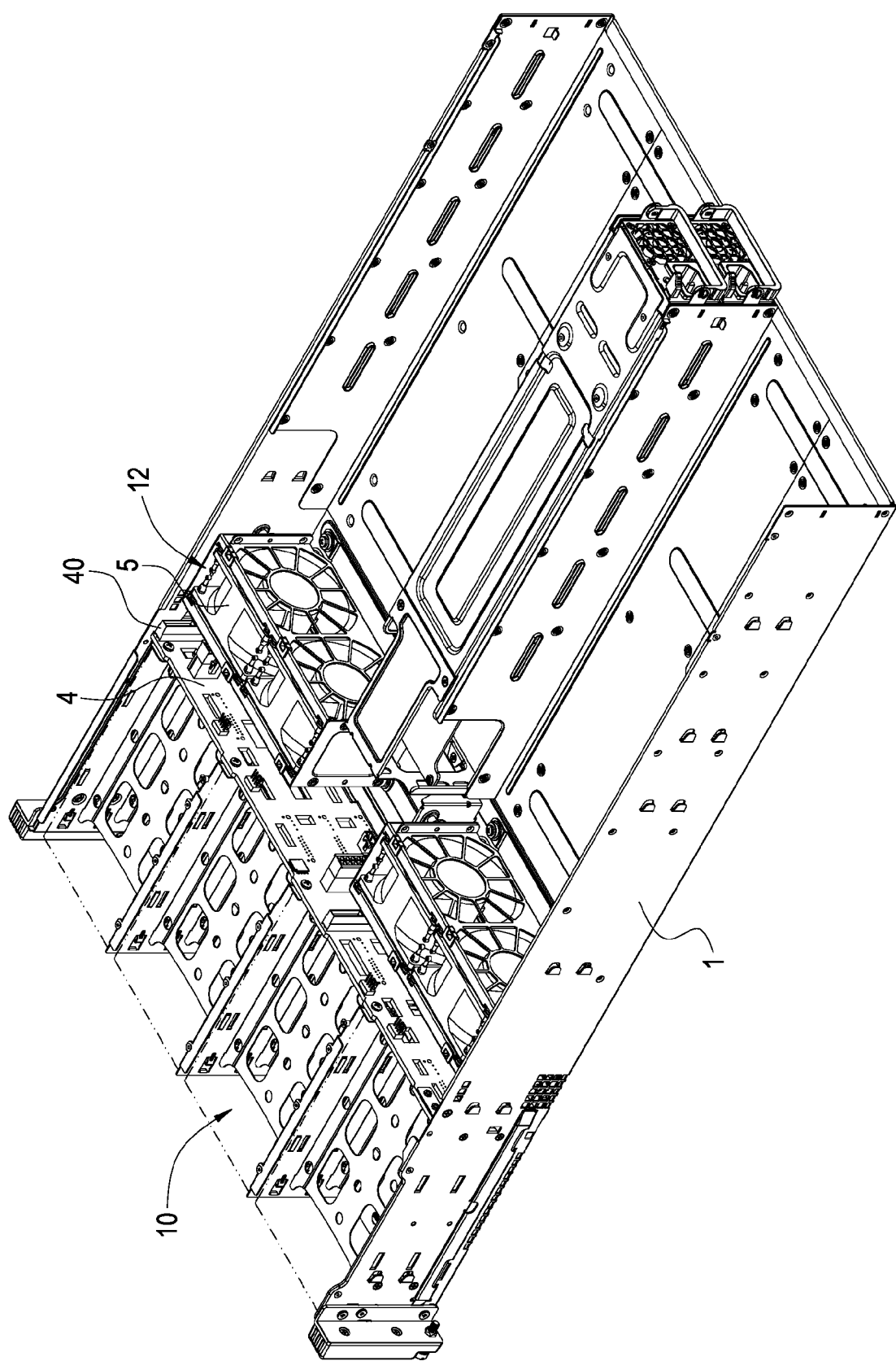
FIG. 3 is a perspective view of the all motherboards of the present invention, which have been drawn out of the chassis shell.

In so doing, the interior of the storage unit section 10 may be provided to install the storage units, for example, the hard disk drive (not shown). The interior of the motherboard section 11 may be provided for installing the motherboard trays 2 therein by a pulling or drawing manner, namely, as shown in FIG. 2 and FIG. 3. The motherboards trays 2 may be disposed by a vertically overlapping manner or a horizontally parallel manner. In this embodiment, the number of the motherboard trays 2 is four, so the manners of both vertically overlapping and horizontally parallel arrangements are adopted to effectively use the internal space of the chassis shell 1.

Figure 4:
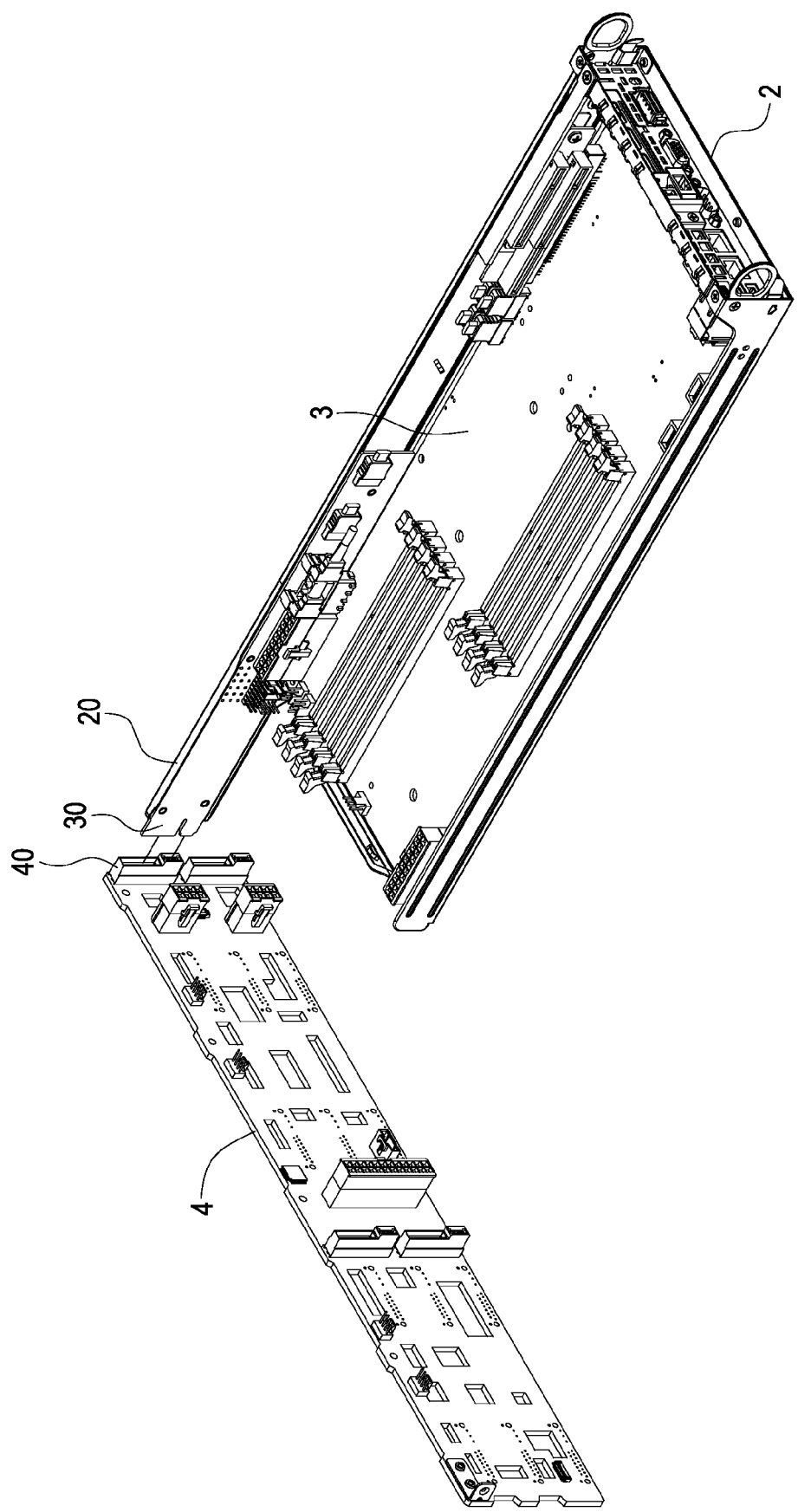
FIG. 4 is an assembled perspective view of the back plate and the motherboard of the present invention.

Please refer to FIG. 4 together, showing that the interior of each motherboard tray 2 may be just provided for arranging an aforementioned motherboard 3 to be laid horizontally therein. Besides, in each motherboard tray 2, at least one side of the motherboard tray 2 is extended a wedge frame 20 toward the storage unit section 10 for fixing a transfer card 30 that supportably provides a hot swapping function to the motherboard 3 and is connected by inserting into the corresponding motherboard 3.

The back plate 4 is arranged by erecting between the storage unit section 10 and the motherboard section 11 for the connection of the storage unit in the storage unit section 10 and for data transfer etc. In order to further fulfill the description of the embodiment proposed by the invention, the back plate 4 is between the storage unit section 10 and the fan section 12. From the motherboard tray 2, the wedge frame 20 passes one side of the fan section 12 and is extended toward the back plate 4. A slot 40 capable of hot swapping function is arranged on the back plate 4 corresponding to the wedge frame 20. So, when being installed on the wedge frame 20, the transfer card 30 may be inserted into the slot 40 for providing the corresponding motherboard 3 with a hot swapping function.

In addition, at least one fan 5 may be disposed in the fan section 12, making fan 5 blow cold air toward each motherboard 3 to further provide a cooling effect.

Accordingly, through the constitution of aforementioned structures, a disposing structure for hot swappable motherboard in industrial computer chassis according to the invention is thus obtained.

Summarizing aforementioned description, the disposing structure according to the invention is an indispensably novel device for a hot swappable motherboard in industrial computer chassis indeed, which may positively reach the expected usage objective for solving the drawbacks of the prior arts, and which extremely possesses the innovation and progressiveness to completely fulfill the applying merits of new type patent, according to which the invention is thereby applied. Please examine the application carefully and grant it as a formal patent for protecting the rights of the inventor.

However, the aforementioned description is only a preferable embodiment according to the present invention, not used to limit the patent scope of the invention, so equivalently structural variation made to the contents of the present invention, for example, description and drawings, is all covered by the claims claimed thereinafter.

What is claimed is:

1. A disposing structure for hot swappable motherboard in industrial computer chassis, including:
    a chassis shell, an interior of which is divided into a storage unit section and a motherboard section, an interior of the storage unit section being arranged at least one storage unit;
    two motherboard trays, which are disposed in the motherboard section, and an interior of each of which is arranged a motherboard, and a side of at least one in which is extended a wedge frame toward the storage unit section, a transfer card having a hot swapping function being arranged on the wedge frame and being arranged by inserting into the corresponding motherboard; and
    a back plate, which is arranged between the storage unit section and the motherboard section, and on which a slot capable of a hot swapping function is arranged corresponding to the wedge frame, by inserting the transfer card into the slot, thereby, providing a hot swapping function.

2. The disposing structure for hot swappable motherboard in industrial computer chassis according to claim 1, wherein the storage unit section is located in a front half part of the chassis shell, while the motherboard section is located in a rear half part of the chassis shell.

3. The disposing structure for hot swappable motherboard in industrial computer chassis according to claim 1, wherein the interior of the chassis shell is further divided by a fan section, which is between the storage unit section and the motherboard section.

4. The disposing structure for hot swappable motherboard in industrial computer chassis according to claim 3, wherein the wedge frame passes the fan section and is extended toward the back plate.

5. The disposing structure for hot swappable motherboard in industrial computer chassis according to claim 3, wherein at least one fan is arranged in the fan section.

6. The disposing structure for hot swappable motherboard in industrial computer chassis according to claim 1, wherein the storage unit is referred to a hard disk drive.

7. The disposing structure for hot swappable motherboard in industrial computer chassis according to claim 1, wherein the two motherboard trays are arranged in the motherboard section by a pulling and drawing manner.

8. The disposing structure for hot swappable motherboard in industrial computer chassis according to claim 1, wherein the two motherboard trays are disposed in the chassis shell by a vertically overlapping manner.

9. The disposing structure for hot swappable motherboard in industrial computer chassis according to claim 1, wherein the two motherboard trays are disposed in the chassis shell by a horizontally parallel manner.

* * * * *